United States Patent
Hirler et al.

(10) Patent No.: US 8,866,221 B2
(45) Date of Patent: Oct. 21, 2014

(54) SUPER JUNCTION SEMICONDUCTOR DEVICE COMPRISING A CELL AREA AND AN EDGE AREA

(75) Inventors: Franz Hirler, Isen (DE); Hans Weber, Bayerisch Gmain (DE); Hans-Joachim Schulze, Taufkirchen (DE); Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 115 days.

(21) Appl. No.: 13/539,973

(22) Filed: Jul. 2, 2012

(65) Prior Publication Data

US 2014/0001552 A1 Jan. 2, 2014

(51) Int. Cl.
*H01L 29/66* (2006.01)

(52) U.S. Cl.
USPC ........... 257/339; 257/492; 257/493; 257/133; 257/E27.055

(58) Field of Classification Search
USPC .................. 257/339, 492, 493, 133, E27.055
See application file for complete search history.

(56) References Cited

U.S. PATENT DOCUMENTS

| 6,410,958 | B1 | 6/2002 | Usui et al. | |
|---|---|---|---|---|
| 7,002,205 | B2 | 2/2006 | Onishi et al. | |
| 8,395,230 | B2 * | 3/2013 | Hozumi et al. | 257/493 |
| 8,421,152 | B2 * | 4/2013 | Sasaki | 257/339 |
| 8,643,056 | B2 * | 2/2014 | Kimura et al. | 257/133 |

FOREIGN PATENT DOCUMENTS

DE 102007046557 A1 4/2009

\* cited by examiner

*Primary Examiner* — Michael Shingleton
(74) *Attorney, Agent, or Firm* — Murphy, Bilak & Homiller, PLLC (57) ABSTRACT

A drift layer of a super junction semiconductor device includes first portions of a first conductivity type and second portions of a second conductivity type opposite to the first conductivity type. The first and second portions are formed both in a cell area and in an edge area surrounding the cell area, wherein an on-state or forward current through the drift layer flows through the first portions in the cell area. At least one of the first and second portions other than the first portions in the cell area includes an auxiliary structure or contains auxiliary impurities to locally reduce the avalanche rate. Locally reducing the avalanche rate increases the total voltage blocking capability of the super junction semiconductor device.

26 Claims, 11 Drawing Sheets

SUPER JUNCTION SEMICONDUCTOR DEVICE COMPRISING A CELL AREA AND AN EDGE AREA

BACKGROUND

In semiconductor devices of the super junction structure a drift layer typically comprises n-doped columns that constitute a current path and p-doped columns provided for obtaining a high reverse breakdown voltage between a drain and a source electrode of the semiconductor device. A high impurity concentration in the n-columns results in a low on-state resistance. If a reverse voltage is applied, depletion zones between the n-doped columns and the p-doped columns extend in a lateral direction such that a high reverse breakdown voltage can be achieved even at high impurity concentrations in the n-columns. It is desirable to improve the reliability of super junction semiconductor devices in the reverse direction.

SUMMARY

According to an embodiment, a super junction semiconductor device includes at least one doped zone in a cell area. In the cell area and in an edge area surrounding the cell area, a drift layer is formed. The drift layer includes first portions of a first conductivity type and second portions of a second conductivity type, which is the opposite of the first conductivity type. An on-state or forward current from/to the at least one doped zone flows through the first portions in the cell area. At least one of the first and second portions other than the first portions in the cell area contains auxiliary impurities or an auxiliary structure operable to locally reduce an avalanche rate.

According to another embodiment, a method of manufacturing a super junction semiconductor device provides forming a drift layer in both a cell area and in an edge area surrounding the cell area. The drift layer includes first portions of a first conductivity type and second portions of a second conductivity type which is the opposite of the first conductivity type. At least one doped zone is formed over the drift layer in the cell area, wherein an on-state or forward current from/to the at least one doped zone flows through the first portions in the cell area. At least one of the first and second portions other than the first portions in the cell area are provided with auxiliary impurities or an auxiliary structure operable to locally reduce an avalanche rate.

Those skilled in the art will recognize additional features and advantages upon reading the following detailed description, and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by the same references in the different drawings if not stated otherwise.

The terms "having", "containing", "including", "comprising" and the like are open and the terms indicate the presence of stated elements or features but not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a low-ohmic connection between the elements electrically connected together, for example a direct contact between the concerned elements or a connection via a metal and/or highly doped semiconductor. The term "electrically coupled" includes that one or more intervening element(s) may be provided between the electrically coupled elements, for example elements that are controllable to temporarily provide a low-ohmic connection, and, at another time a non-low-ohmic connection.

Figure 1A:
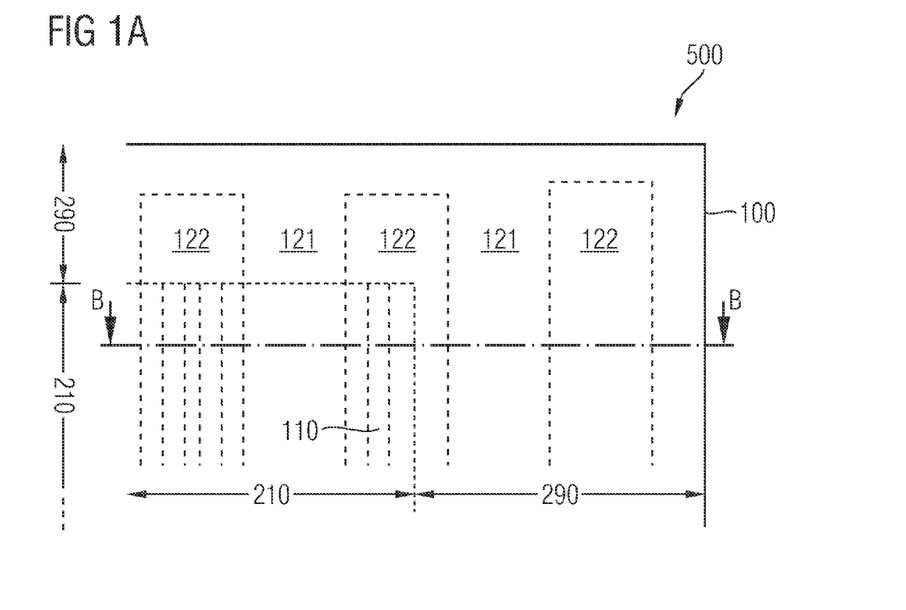
FIG. 1A is a schematic cross-sectional view through a section of a semiconductor body of a super junction semiconductor device in a plane parallel to a surface in accordance with an embodiment related to a drift layer having stripe-shaped p-doped portions containing auxiliary impurities in a cell and an edge area.
Figure 1B:
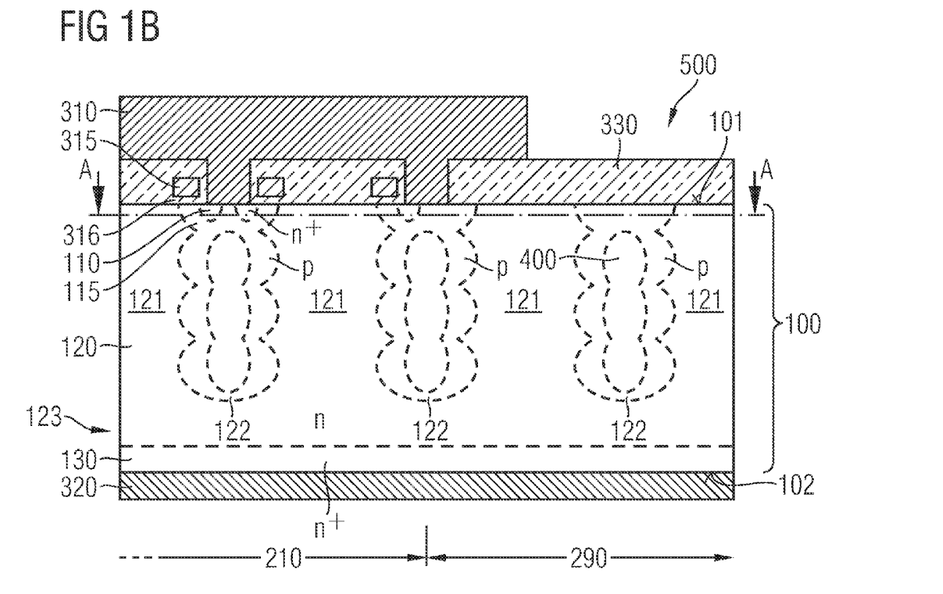
FIG. 1B is a schematic cross-sectional view of the super junction semiconductor device of FIG. 1A along line B-B.

FIGS. 1A and 1B show a super junction semiconductor device 500, wherein FIG. 1A is a cross-sectional view in a plane parallel to a first surface 101 of a semiconductor body 100 as indicated by line A-A in FIG. 1B and FIG. 1B is a cross-sectional view perpendicular to the cross-sectional plane of FIG. 1A along line B-B in FIG. 1A.

A semiconductor body 100 includes a single-crystalline semiconducting material, for example silicon Si, silicon carbide SiC, germanium Ge, a silicon-germanium SiGe or gallium arsenide GaAs. The semiconductor body 100 has a first surface 101 and a second surface 102 which is parallel to the first surface 101. A distance between the first and a second surface 101, 102 is in the range of several ten micrometers or more and is closely related to the reverse breakdown voltage which is the minimum applied voltage that causes the semiconductor device 500 to break down.

The semiconductor body 100 may have a rectangular shape with an edge length in the range of several millimeters. The semiconductor body 100 includes a doped layer 130 of a first conductivity type. A net dopant concentration in the doped layer 130 is comparatively high and may be at least $10^{17}$ cm$^{-3}$, for example. The doped layer 130 may extend along a complete cross-sectional plane of the semiconductor body 100 parallel to the second surface 102. According to an embodiment, the doped layer 130 directly adjoins the second surface 102. According to other embodiments, a further layer may be provided between the doped layer 130 and the second surface 102. For example, a further doped layer of a second conductivity type, which is the opposite of the first conductivity type, may be provided between the doped layer 130 and the second surface 102. The doped layer 130 forms a contact layer to an electrode and may be doped by an implant from the second surface 102.

A drift layer 120 is formed between the first surface 101 and the doped layer 130. For example, the doped layer 130 may be a base substrate for an epitaxial growth of the drift layer 120. The drift layer 120 includes first portions 121 of the first conductivity type and second portions 122 of the second conductivity type. The second portions 122 may be formed in direct contact with the doped layer 130. According to other embodiments the second portions 122 are formed offset to the doped layer 130 such that the drift layer 120 includes a contiguous portion 123 of the first conductivity type extending between the first and second portions 121, 122 on the one hand and the doped layer 130 on the other hand. The drift layer 120 may directly adjoin the doped layer 130. According to other embodiments a further layer of the first conductivity type may be provided between the drift layer 120 and the doped layer 130.

The semiconductor body 100 includes a cell area 210 and an edge area 290 surrounding the cell area 210, wherein the edge area 290 extends along the edge of the semiconductor body 100. Through those first portions 121 that are situated within the cell area 210, in the on-state of the semiconductor device 500 an on-state or forward current flows through the drift layer 120 to the doped layer 130. In contrast, first portions 121 situated in the edge area 290 do not significantly or not at all contribute to the on-state or forward current.

At least one structure or component allowing an on-state or forward current to flow in the first portions 121 of the cell area 210, for example a gate electrode, a source zone, a source contact, a base zone or a gate contact, is not provided in the edge area 290, without connection, or inoperable for other reasons.

The semiconductor body 100 further comprises at least one doped zone 110 formed in the cell area 210. According to an embodiment, a plurality of doped zones 110 of the first conductivity are provided, wherein each of the doped zones 110 directly adjoins a base zone 115 of the second conductivity type, each base zone 115 directly adjoining at least one of the first and one of the second portions 121, 122 in the cell area 210 to form a super junction IGFET (insulated gate field effect transistor) or a super junction IGBT (insulated gate bipolar transistor) device. According to another embodiment the at least one doped zone 110 is of the second conductivity and directly adjoins the first and second portions 121, 122 in the cell area 210 to form a super junction diode. In the edge area 290, the doped zones 110 are absent, without connection to an electrode, or not operable for other reasons.

Gate electrode structures 315 may be provided to control a charge carrier distribution in the base zone 115 in a channel region between the doped zones 110 and the first portions 121 of the drift layer 120 along a gate dielectric 316. The gate dielectric 316 is arranged between the gate electrode structures 315 and the base zones 115. A first electrode 310 may be electrically coupled to the base zones 115 and the doped zones 110. A dielectric layer 330 between the first electrode 310 and the semiconductor body 100 electrically insulates the first portions 121 from the first electrode 310. In the illustrate embodiment, the gate electrode structures 315 may be arranged above the first surface 101. According other embodiments related to IGFETs and IGBTs the gate electrode structures 315 may be formed in trenches etched into the drift layer 120 from the first surface 102.

The first electrode 310 electrically contacts the doped zones 110 and the base zones 115 through openings in the dielectric layer 330. According to an embodiment, the first electrode 310 does not contact the second portions 122 in the edge area 290. According to other embodiments the first electrode 310 may contact one or more of the first portions 122 in the edge area 290 via further openings in the dielectric layer 330.

A second electrode 320 may directly adjoin the doped layer 130. According to embodiments related to IGBTs a further doped layer of the second conductivity type may be formed between the doped layer 130 and the second electrode 320. According to the illustrated embodiment, the first conductivity type is the n-type, the second conductivity type is the p-type, the first electrode 310 is a source electrode, the doped zones are source zones, and the second electrode 320 is a drain electrode. According to other embodiments, the first conductivity type is the p-type.

At least one of the first and second portions 121, 122 other than the first portions 121 in the cell area 210 includes an auxiliary structure, contains auxiliary impurities or includes an auxiliary structure and contains auxiliary impurities. Auxiliary structures and auxiliary impurities are in substance absent in the cell area.

According to an embodiment related to the auxiliary impurities the auxiliary impurities locally reduce a charge carrier mean free path, which is the average distance a charge carrier travels between successive collisions. At a reduced mean free path, charge carriers absorb less energy between collisions such that a higher electric field strength is required to generate an electron-hole pair and to trigger an avalanche breakdown.

According to another embodiment related to auxiliary impurities, the auxiliary impurities are operable to locally reduce an electric field strength. Reducing locally the electric field strength and/or the charge carrier mean free path reduces the avalanche rate in selected regions such that the reverse breakdown voltage can be locally increased. According to embodiments related to an auxiliary structure, the auxiliary structure is operable to locally reduce an electric field strength.

FIGS. 1A and 1B relate to an embodiment with the second portions 122 of both the cell area 210 and the edge area 290 containing auxiliary impurities 400. The first portions 121 in the cell area 210 do not contain the auxiliary impurities or contain them at a concentration that is significantly lower than outside the first portions 121 in the cell area 210, for example at a concentration lower than 10% of that in the other portions. The auxiliary impurities 400 reduce at least one of charge carrier mobility. As a consequence, the mean free path for charge carriers is reduced, and a reverse breakdown voltage can be increased locally without increasing the on-state resistance defined by the first portions 212 in the cell area 210.

Typically, in super junction semiconductor devices the maximum electric field strength is near the center of the first and second portions 121, 122. Depending on the manufacturing process, the maximum electric field strength may occur in the center of the second portions 122. By reducing the mean free path of charge carriers at least in the central portions of the second portions 122, a critical electric field strength at which a local avalanche breakdown occurs in the second portions 122 may be increased such that the reverse breakdown voltage of the semiconductor device 500 is only defined by the minimum reverse breakdown voltage of the first portions 121.

According to an embodiment, the auxiliary impurities 400 are predominantly provided in and close to a central portion of the second portions 122. According to other embodiments the auxiliary impurities 400 are distributed over approximately the whole volume of the second portions 122. In accordance with an embodiment providing an epitaxy process for forming the drift layer 120 in an iterative process, wherein each iteration step includes growth of a sub-layer and implanting donors and/or acceptors in the grown sub-layer to form the first and second portions 121, 122 the auxiliary impurities 400 may be implanted in at least one of the iteration steps, in some of the iteration steps, or in each of the iteration steps. The auxiliary impurity implants may differ as regards the implant energy and more than one auxiliary impurity implant may be performed at different implant energies in at least one of the iteration steps.

The auxiliary impurities 400 may be atoms of elements that are operable to increase a scattering of charge carriers in the drift layer 120. In accordance with an embodiment the auxiliary impurities 400 are atoms that increase scattering of charge carriers by a perturbation of a crystal potential due to substituting atoms of the semiconductor material of the drift layer 120 in the crystal lattice thereby causing alloy scattering. For example, the drift layer 120 is provided from silicon and the auxiliary impurity atoms are germanium Ge or carbon C atoms which replace some of the silicon atoms in the silicon crystal lattice of the drift layer 120.

According to other embodiments, the auxiliary impurity atoms are dopants of the first conductivity type. For example, if the conductivity type of the second portions 122 is the p-type, the impurity atoms are of the n-type, for example phosphorus P atoms or arsenic As atoms. The counter-doping may also reduce minority carrier lifetime by increasing the recombination rate. The avalanche rate is decreased. A counter-doping through auxiliary impurities 400 which are effective as donors or acceptors may be compensated by increasing the concentration of dopants of the other conductivity type in order to maintain a predetermined net dopant concentration for achieving the desired compensation effect between the first and the second portions 121, 122. For example, an auxiliary implant includes molecules containing the same number of donor and acceptor atoms or ions.

A concentration of the auxiliary impurities 400 is at least in the range of that of the dopants. The auxiliary impurity concentration may be higher than that of the dopant concentration, for example by a factor of ten. For example, the second portions 122 may have a net dopant concentration of about $10^{15}$ cm$^{-3}$ to $10^{16}$ cm$^{-3}$ and an auxiliary impurity concentration, e.g. an absolute n-type dopant concentration, of $10^{17}$ cm$^{-3}$.

While the embodiment illustrated in FIGS. 1A and 1B provides the auxiliary impurities 400 in the second portions 122 of both the cell area 210 and the edge area 290, other embodiments may provide the auxiliary impurities 400 only in second portions 122 located close to an edge of the cell area 210 and in the edge area 290 or only in all or some of the second portions 122 situated in the edge area 290.

Provided a similar construction and arrangement of the first and second portions 121, 122 in both the cell area 210 and the edge area 290, close to the edge area 290 the electric field strength is higher than in the cell area 210, because in the edge area 290 and close to the edge area 290 equipotential lines are bent from a horizontal direction parallel to the first and second surfaces 101, 102 into a direction vertical to the first and surfaces 101, 102, thus locally increasing the electric field strength. In the corners of a rectangular semiconductor body 100 the bending is further increased. Hence, providing impurities in the second portions 122 in the edge area 290 or both in the edge area 290 and a section of the cell area 210 adjoining the edge area 290 contributes to a higher degree to the reliability of the semiconductor device 500 than providing auxiliary impurities in the second portions 122 of a central section of the cell area 210.

Figure 2A:
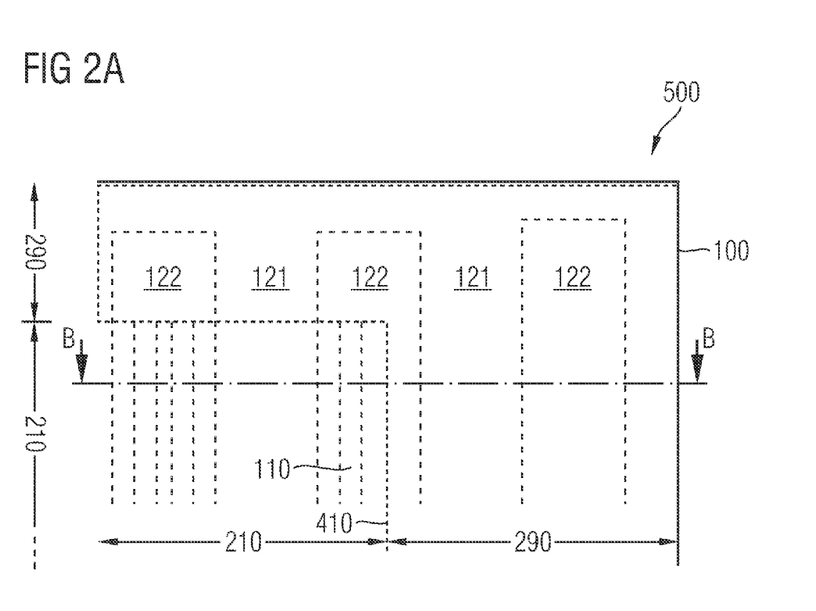
FIG. 2A is a schematic cross-sectional view of a section of a semiconductor body of a super junction semiconductor device in a plane parallel to a surface in accordance with an embodiment related to stripe-shaped p-doped portions in the drift layer and auxiliary impurities provided in an edge area of the semiconductor body.
Figure 2B:
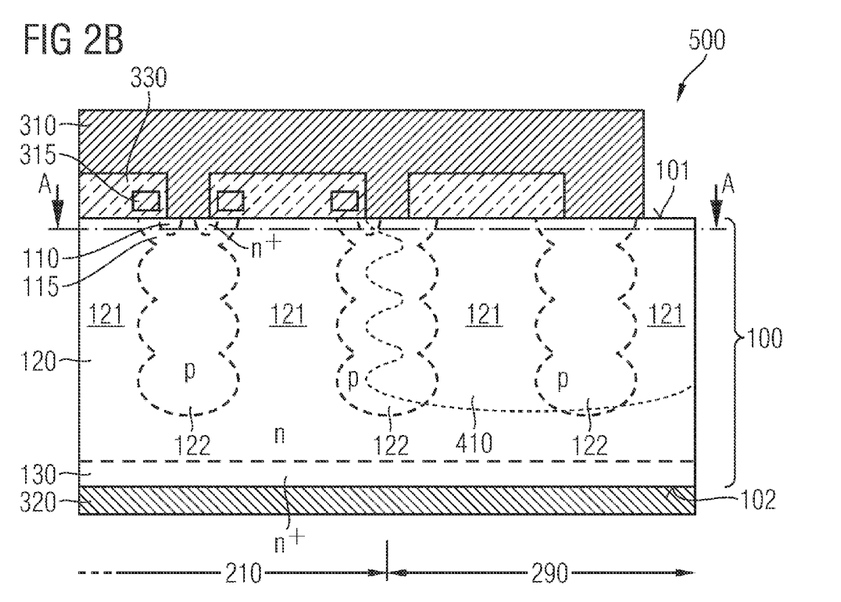
FIG. 2B is a schematic cross-sectional view of the super junction semiconductor device of FIG. 2A along line B-B.

The embodiment illustrated in FIGS. 2A and 2B refers to a region containing auxiliary impurities 410 in the edge area 290, wherein the region containing the auxiliary impurities 410 overlaps with both the first and the second portions 121, 122 in the edge area 290. The auxiliary impurities 410 reduce the mean free path both in the first and the second portions 121, 122 of the edge area 210. The reduction of the free mean path in both portions 121, 122 locally increases the critical electrical field strength in the whole edge area 290 and contributes to an increased reliability of the semiconductor device 500.

According to the illustrated embodiment, the first electrode 310 contacts the second portions 122 in the edge area 290. According to other embodiments, the second portions and the first portions 122, 121 in the edge area 290 may float. Since no gate electrodes and/or doped zones 110 are provided in the edge area 290, the first portions 121 in the edge areas 290 do not significantly contribute to an on-state or forward current. Hence, the reduction of the mean free path in the first portions 121 in the edge area 290 does not increase the on-resistance of the semiconductor device 500.

Figure 3A:
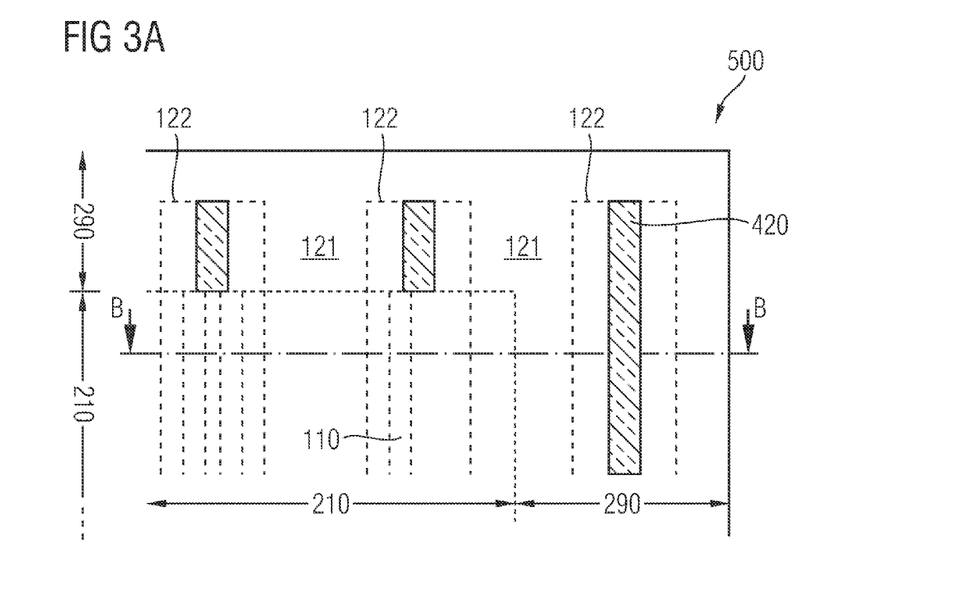
FIG. 3A is a schematic cross-sectional view of a section of a semiconductor body of a super junction semiconductor device in a plane parallel to a surface in accordance with an embodiment related to a drift layer with stripe-shaped p-doped portions including an auxiliary structure.
Figure 3B:
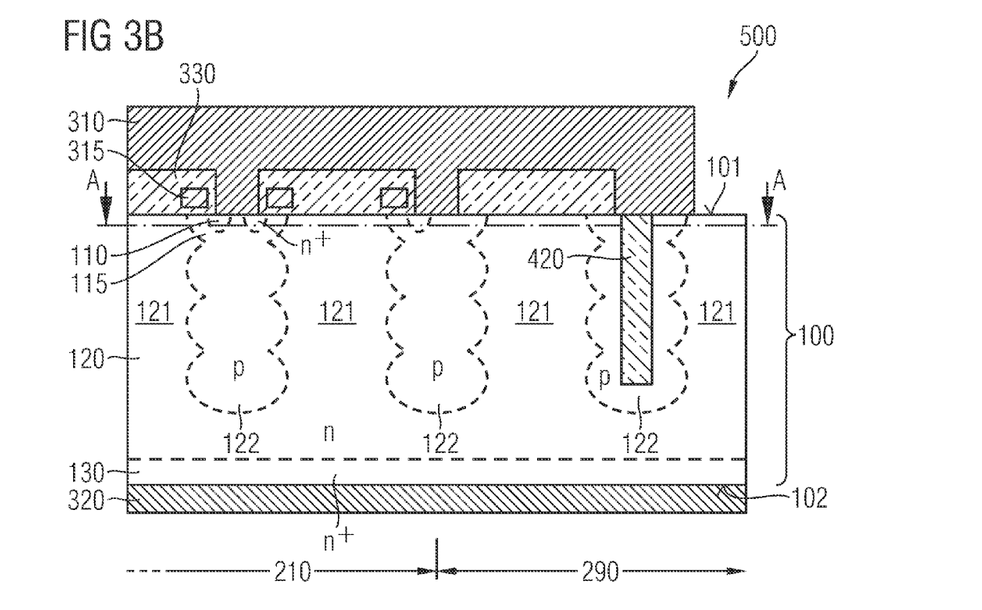
FIG. 3B is a schematic cross-sectional view of the super junction semiconductor device of FIG. 3A along line B-B.

The embodiment illustrated in FIGS. 3A and 3B differs from the embodiment of FIGS. 2A and 2B in that instead of auxiliary impurities an auxiliary structure 420 is provided. The auxiliary structure 420 may be provided in a central portion of some or each of the second portions 122 as illustrated. According to other embodiments, the auxiliary structure 420 may also be provided in a central portion of the first portions 121 in the edge area 290 or both in the central regions of the first portions 121 situated in the edge area 290 and in further first portions 121 situated in the cell area 210 in a region close to the edge area 290. The auxiliary structure 420 may be provided from oxides, for example oxides containing a positive charge. According to an embodiment, a silicon oxide with cesium Cs provides the charged oxide. According to another embodiment the auxiliary structure 420 is provided from a dielectric material having a dielectric permittivity equal to or close to that of the semiconductor material of the drift layer 120. For example, the material of the drift layer 120 is silicon and the dielectric material is alumina $Al_2O_3$.

Figure 4A:
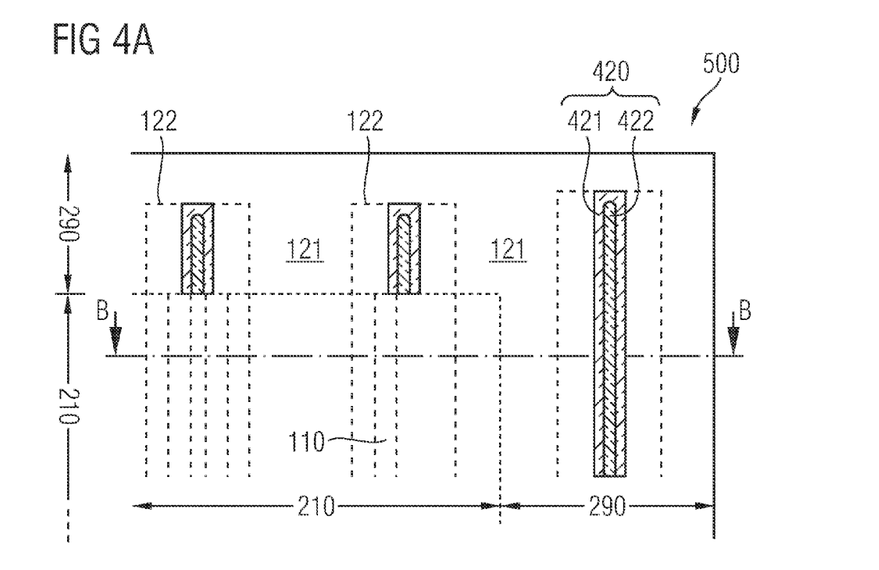
FIG. 4A is a schematic cross-sectional view of a section of a semiconductor body of a super junction semiconductor device in a plane parallel to a surface in accordance with an embodiment providing a drift layer with stripe-shaped p-doped portions including a multi-layer auxiliary structure.
Figure 4B:
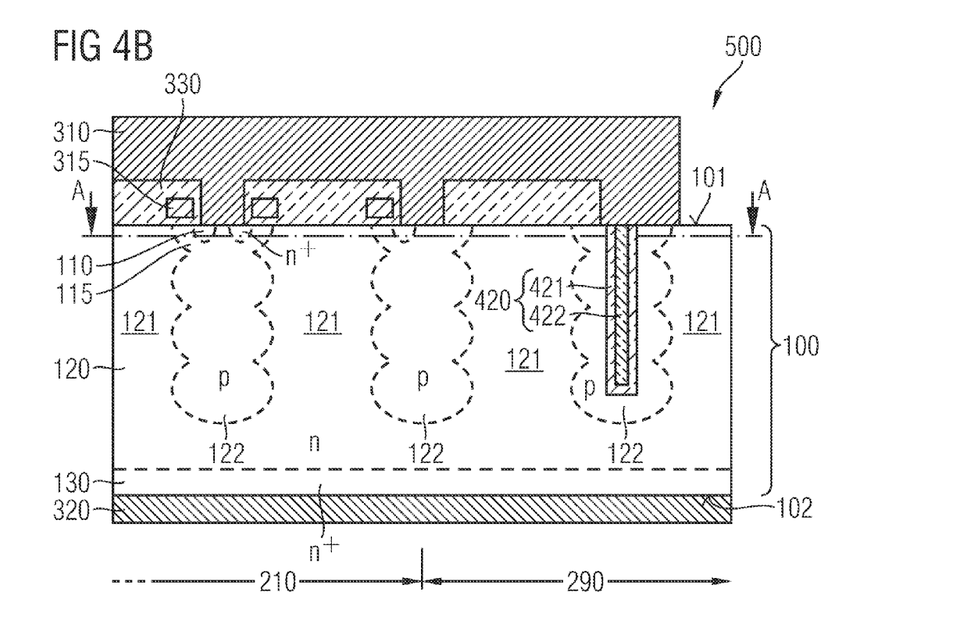
FIG. 4B is a schematic cross-sectional view of the super junction semiconductor device of FIG. 4A along line B-B.

According to the embodiment illustrated in FIGS. 4A and 4B the dielectric structure 420 comprises at least two sub-layers of different materials, wherein a mean dielectric permittivity deviates from that of the semiconductor material of the drift layer 120 by not more than 20%. For example, one of the first sub-layers 421, 422 may be a silicon oxide and the other sub-layer 422, 421 may be aluminum nitride AlN or hafnium oxide $HfO_2$. According to another embodiment, one of the sub-layers 421, 422 is made of zirconium oxide $ZrO_2$ and the other sub-layer 422, 421 is made of titanium oxide $TiO_2$.

Figure 5A:
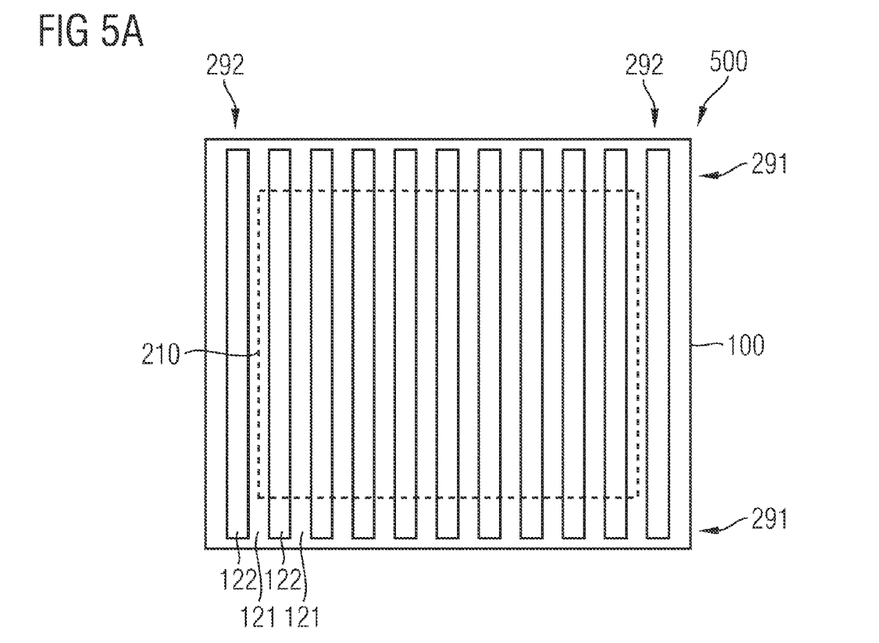
FIG. 5A is a schematic cross-section view through a drift layer of a super junction semiconductor device in accordance with an embodiment providing stripe-shaped first and second portions extending from a cell area into first edge areas and parallel to the cell area in second edge areas.
Figure 5B:
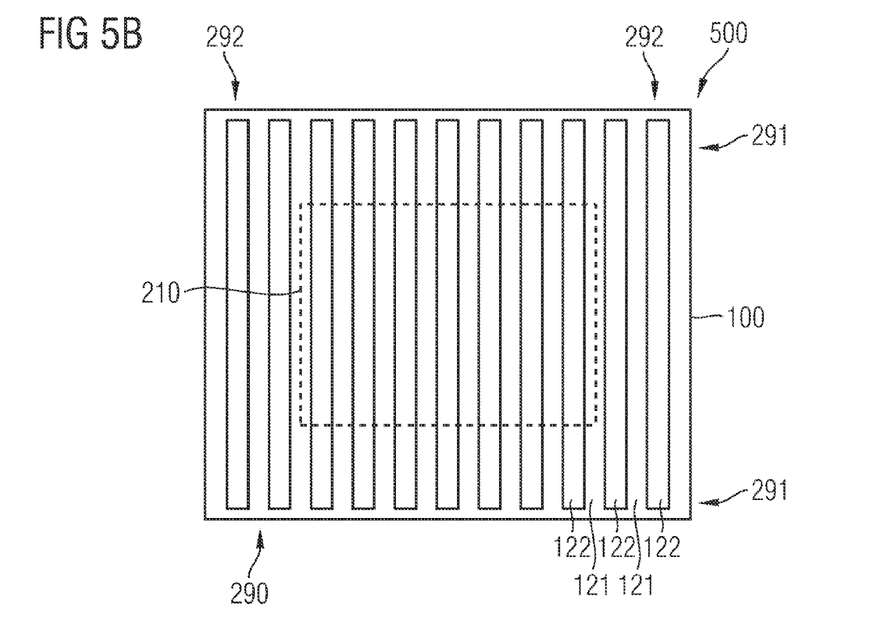
FIG. 5B is a schematic cross-sectional view through a drift layer in accordance with a further embodiment providing stripe-shaped first and second portions extending from the cell area into first edge areas and parallel to the cell area in second edge areas.

FIGS. 5A to 5B show by way of example layouts for the first and second portions 121, 122 for which auxiliary impurities and/or auxiliary structures as discussed above may be provided.

FIG. 5A shows a regular arrangement of first and second portions 121, 122, wherein the first and second portions 121, 122 are stripe-shaped and are arranged in alternating order and parallel to one of the edges of a semiconductor body 100 of a super junction semiconductor device 500. A subset of the first and second portions 121, 122 extend from the cell area 210 into first edge areas 291 extending along two opposing edges of the semiconductor body 100. At least one second portion 122 is completely formed in one of two second edge areas 292 between the cell area 210 and further edges of the semiconductor body 100. The cell area 210 differs from the edge areas 291, 292 in that in the cell area 210 all components and structures effecting an on-state or forward current through the first portions 121 are fully functional whereas in the edge areas 291, 292 at least one of these components or structures is missing, not connected or not functional. While the first portions 121 in the cell area 210 contribute to an on-state or forward current, the first portions situated in the edge areas 291, 292 do not.

The embodiment illustrated in FIG. 5B differs from the embodiment of FIG. 5A in wider edge areas 291, 292 and in that in each of the second edge areas 292 at least two complete second portions 122 are formed.

Figure 5C:
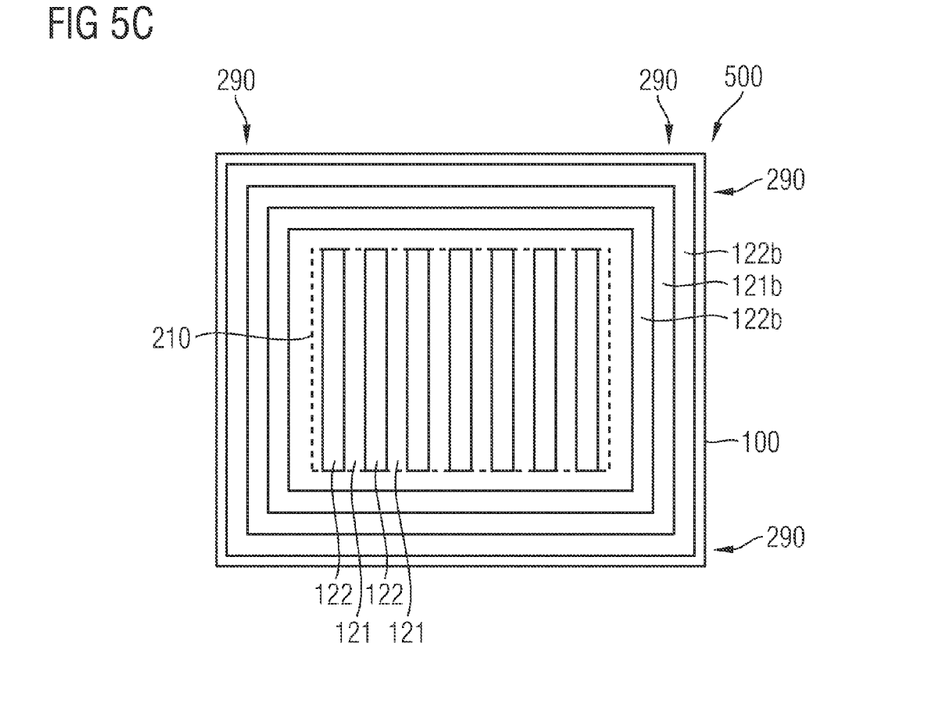
FIG. 5C is a schematic cross-sectional view through a drift layer of a super junction semiconductor device in accordance with an embodiment providing parallel first and second portions in a cell area and frame-like first and second portions in an edge area.

FIG. 5C refers to an embodiment with first and second portions 121, 122 formed in the cell area 210. In the edge area 290, frame-like first and second portions 121b, 122b surround the cell area 210 in alternating order. Both the first and the second frame-like portions 121b, 122b may be contiguous as illustrated or may be discontinuously formed. For example, the second frame-like portions 122b may include four separate sections not connected at the corners or close to the corners of the frame.

Figure 6A:
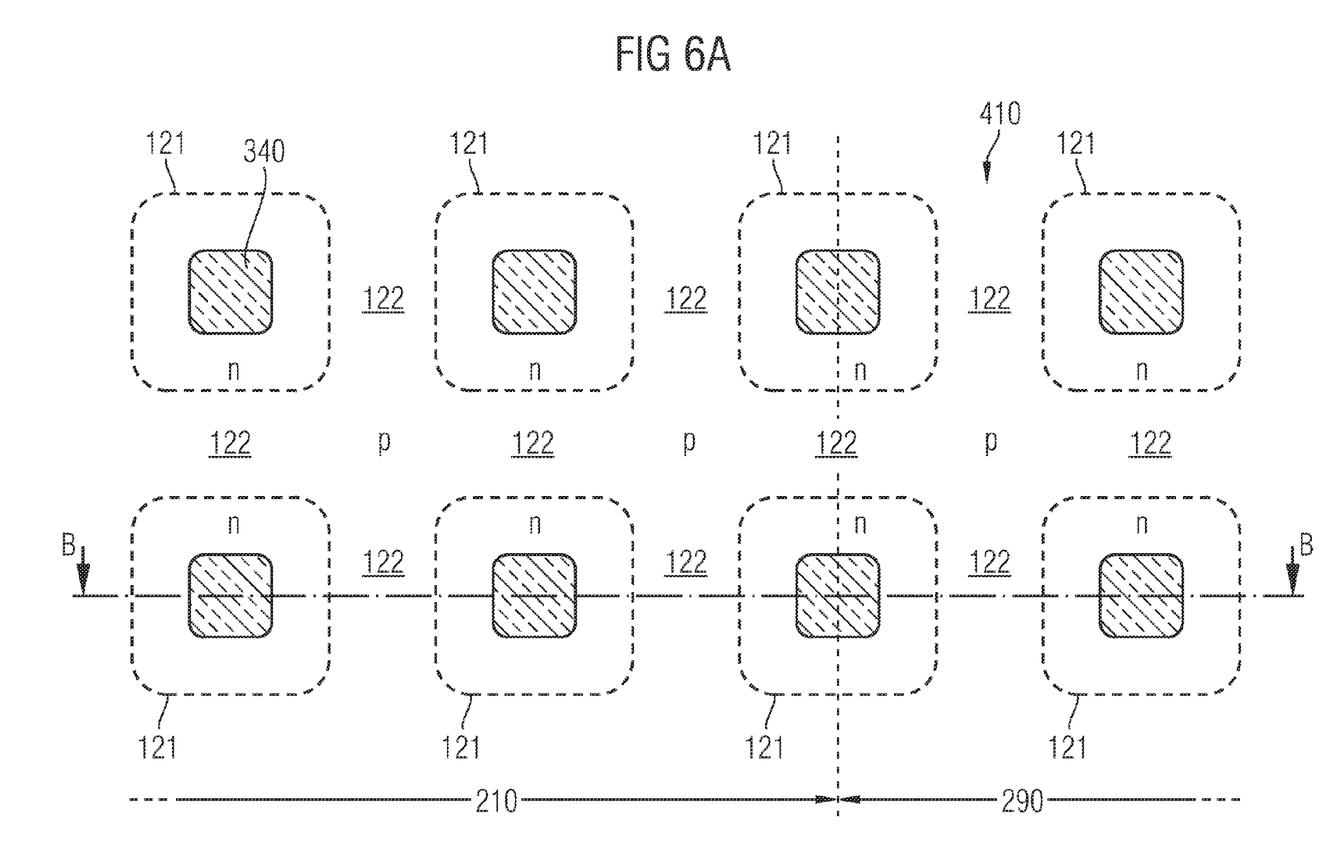
FIG. 6A is a schematic cross-sectional view through a drift layer of a super junction semiconductor device parallel to a surface in accordance with an embodiment with first portions of the drift layer formed by out-diffusion from trench sidewalls.
Figure 6B:
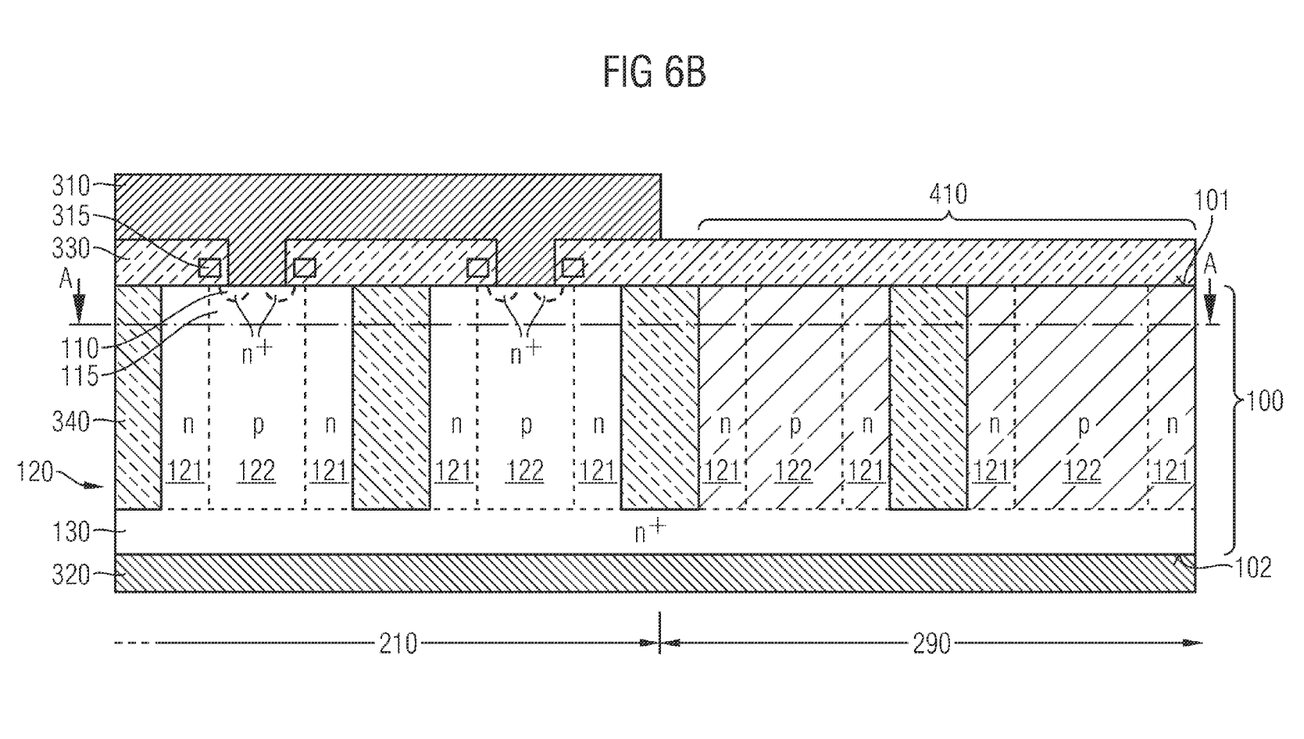
FIG. 6B is a schematic cross-sectional view of the super junction semiconductor device of FIG. 6A along line B-B.

FIGS. 6A and 6B refer to an embodiment providing the first and second portions 121, 122 by out-diffusion from sidewalls of trenches etched into an intrinsic or homogeneously doped layer. The trenches may be stripe-shaped grooves. According to the illustrated embodiment, the trenches are approximately square-shaped. According to other embodiments, the trenches have a hexagonal or round cross-sectional shape.

A semiconductor body 100 has a first surface 101 and a second surface 102 parallel to the first surface 101. At least one doped zone 110 is formed directly adjoining the first surface 101. Further a doped layer 130, which is of a first conductivity type, is formed in the semiconductor body 100. According to embodiments related to super junction diodes and super junction IGFETs, the doped layer 130 directly adjoins the second surface 102. According to other embodiments, for example embodiments related to IGBTs, at least one further layer of a second conductivity type which is the opposite of the first conductivity type, may be arranged between the doped layer 130 and the second surface 102. The at least one doped zone 110 may be one single doped zone of the second conductivity type formed in a cell area 210, for example, if the semiconductor device 500 is a super junction diode. According to embodiments related to IGFETs and IGBTs, a plurality of doped zones of the first conductivity type are provided in the cell area 210 of the semiconductor body 100, wherein each doped zone 110 is formed as a well in a base zone 115 of the second conductivity type.

Both in the cell area 210 and in an edge area 290 extending along an edge of the semiconductor body 100 and surrounding the cell area 210 a drift layer 120 is arranged between the at least one doped zone 110 and the doped layer 130. The drift layer 120 includes first portions 121 of the first conductivity type and second portions 122 of the second conductivity type. The drift layer 120 further includes dielectric structures 340 resulting from a fill of the trenches etched for sidewall implantation. The first portions 121 encircle the dielectric structures 340 forming a rectangular hollow cylinder of uniform thickness. The second portions 122 form a grid embedding the cylindric first portions 121.

In the cell area 210 gate electrode structures 315 are provided to control a minority charge carrier distribution in a section of the base zones 115 between the doped zones 110 and the first portions 121. A first electrode 310 may be electrically connected to the doped zones 110 and the base zone 115. Each base zone 115 may be a section of or may directly adjoin the second portions 122. A dielectric layer 330 may separate the first electrode 310 from the first portions 121. The first electrode 310 may or may not be electrically connected to the second portions 122 in the edge area 290.

An on-state or forward current flows through the first portions 121 in the cell area 210. At least one of the first and second portions 121, 122 other than the first portions 121 in the cell area 210 includes an auxiliary structure or contains auxiliary impurities 410 locally reducing the mean free path or the electric field strength at least in a central portion of the concerned first and second portions 121, 122.

For example, at least in the second portions 122 in the edge area 290 auxiliary impurities 410 are implanted which reduce the mean free path of charge carriers in the second portions 122 in the edge area 290, for example auxiliary impurity atoms substituting atoms of the semiconductor material in the single crystalline lattice or auxiliary impurity atoms being effective as donors or acceptors. According to an embodiment, the second portions 122 contain both first auxiliary impurities of the first conductivity type and second auxiliary impurities of the second conductivity type compensating for the first auxiliary impurities of the first conductivity type. Since the mean free path is reduced in sections of the drift layer 120 where the electric field strength is increased due to edge effects, the blocking voltage capability of the edge area 290 is locally increased and operable to that in the cell area 210 without increasing the on-state resistance. According to another embodiment at least central portions of the second portions 122 include an auxiliary structure or are counter-doped for locally reducing the electric field strength.

Figure 7A:
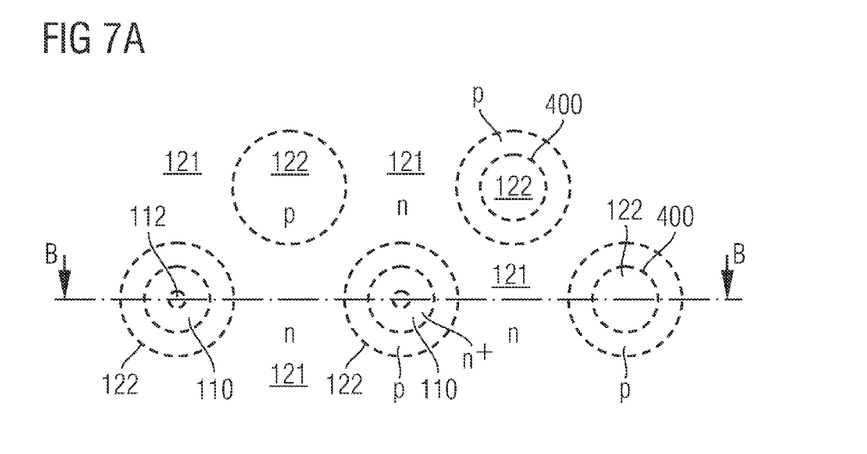
FIG. 7A is a schematic cross-sectional view through a drift layer of a super junction semiconductor device in accordance with an embodiment related to p-doped pillars embedded in an n-type grid.
Figure 7B:
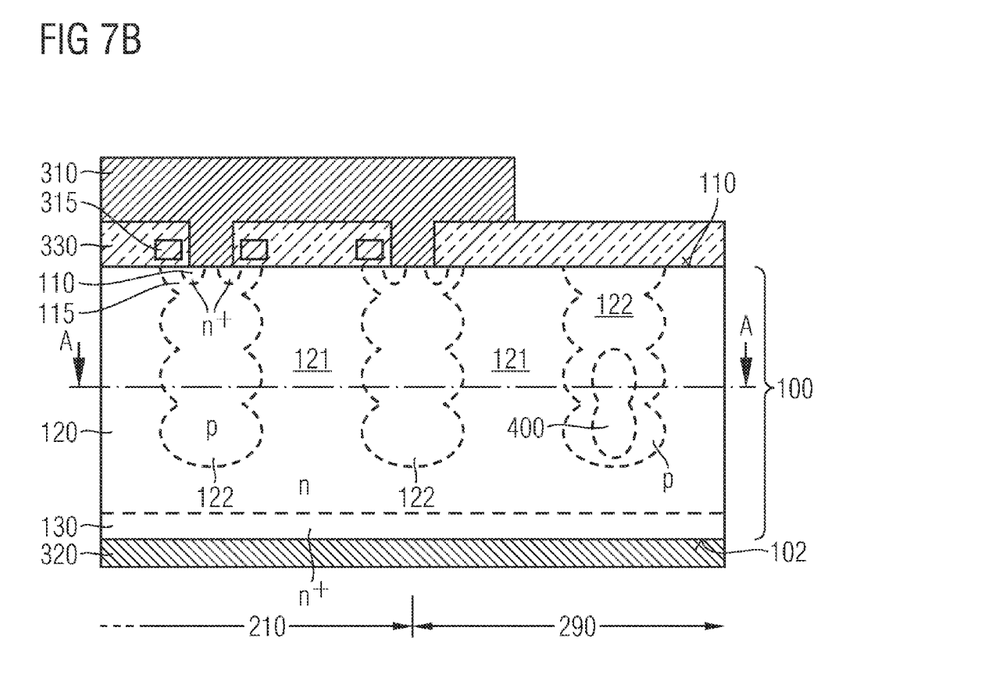
FIG. 7B is a schematic cross-sectional view of the super junction semiconductor of FIG. 7A along line B-B.

The embodiment of FIGS. 7A and 7B refers to pillar-like second portions 122 embedded in a grid formed by the first portions 121. The cross-section of the second portion 122 may be round, elliptic, quadratic, rectangular, or polygonal.

Figure 8:
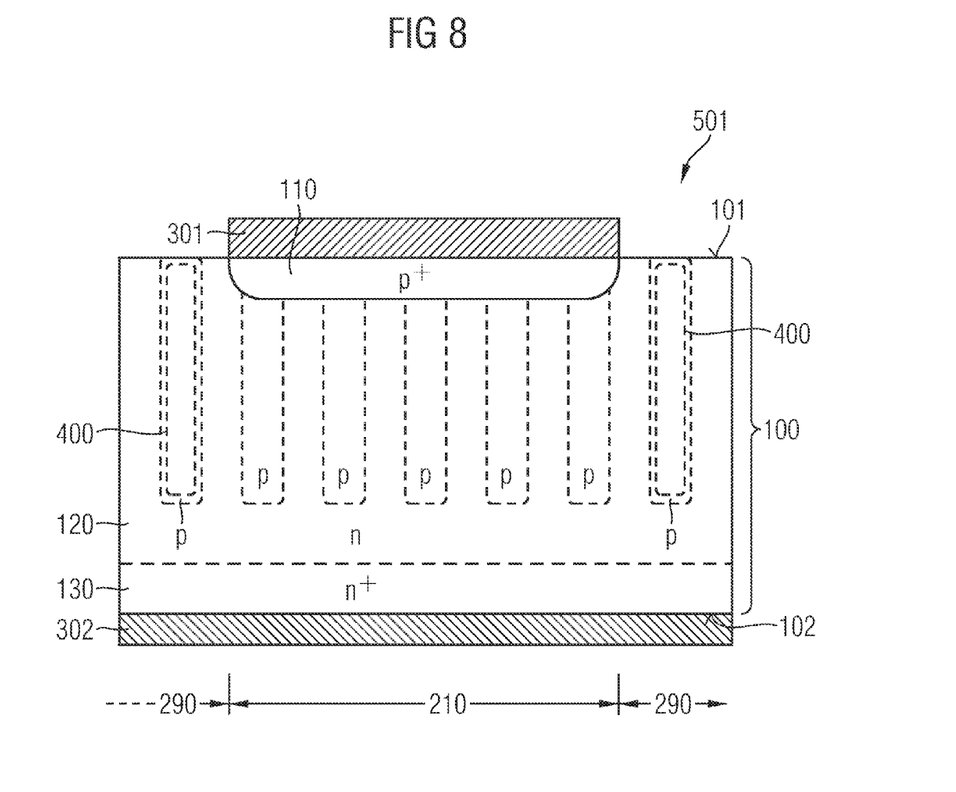
FIG. 8 is a simplified cross-sectional view of a super junction semiconductor device in accordance with an embodiment related to a super junction diode.

FIG. 8 shows a super junction diode 501. A semiconductor body 100 includes a doped zone 110 and a doped layer 130. The doped layer 130 may be of a n-type. The doped zone 110 may be of the p-type. The doped zone 110 directly adjoins a first surface 101 of the semiconductor body 100. The doped layer 130 directly adjoins a second surface 102 of the semiconductor body 100 which is parallel to the first surface 101. An anode electrode 301 is in direct electric contact with the doped zone 110. A cathode electrode 302 is in direct electric contact with the doped layer 130. Between the doped zone 110 and the doped layer 130, a drift layer 120 is formed in both a cell area 210 and in an edge area 290 surrounding the cell area 210. The drift layer 120 includes first portions 121 of the n-type and second portions 122 of the p-type.

When the super junction diode 501 is forward-biased, a forward current flows through the first portions 121 in the cell area 210. At least one of the first and second portions 121, 122 other than the first portions 121 in the cell area 210 includes auxiliary impurities 400 and/or an auxiliary structure where the mean free path is reduced compared to regions outside the auxiliary structure and without auxiliary impurities 400. According to an embodiment, at least one of the second portions 122 in the edge area 290, for example the second portions 122 closest to an edge of the semiconductor body 100 contains the auxiliary impurities 400 or includes the auxiliary structure. According to other embodiments, each of the second portions 122 in the edge area 290 is provided with an auxiliary structure and/or contains auxiliary impurities 400. In accordance with another embodiment, at least some of the second portions 122 in the cell area 210 or all of them may include auxiliary structures or contain auxiliary impurities 400. According to further embodiments, one, some or all of the first portions 121 in the edge area 290 may include an auxiliary structure or contain auxiliary impurities 400. The auxiliary impurities 400 may be provided in a sub area of the edge area 290 close to the edge of the semiconductor body 100 or in the whole edge area 290.

The auxiliary impurities 400 reduce the mean free path of charge carriers in regions of the drift layer 120, in which the electrical field strength has a maximum. The charge carriers absorb less energy and hence a critical electric field strength, at which electron-hole pairs are generated and an avalanche breakdown is triggered, is increased. The auxiliary impurities 400 increase the voltage blocking capability in the edge area 290 of the super junction diode 501 and may at least approximate the voltage blocking capability in the edge area 290 to that in the cell area 210.

Figure 9:
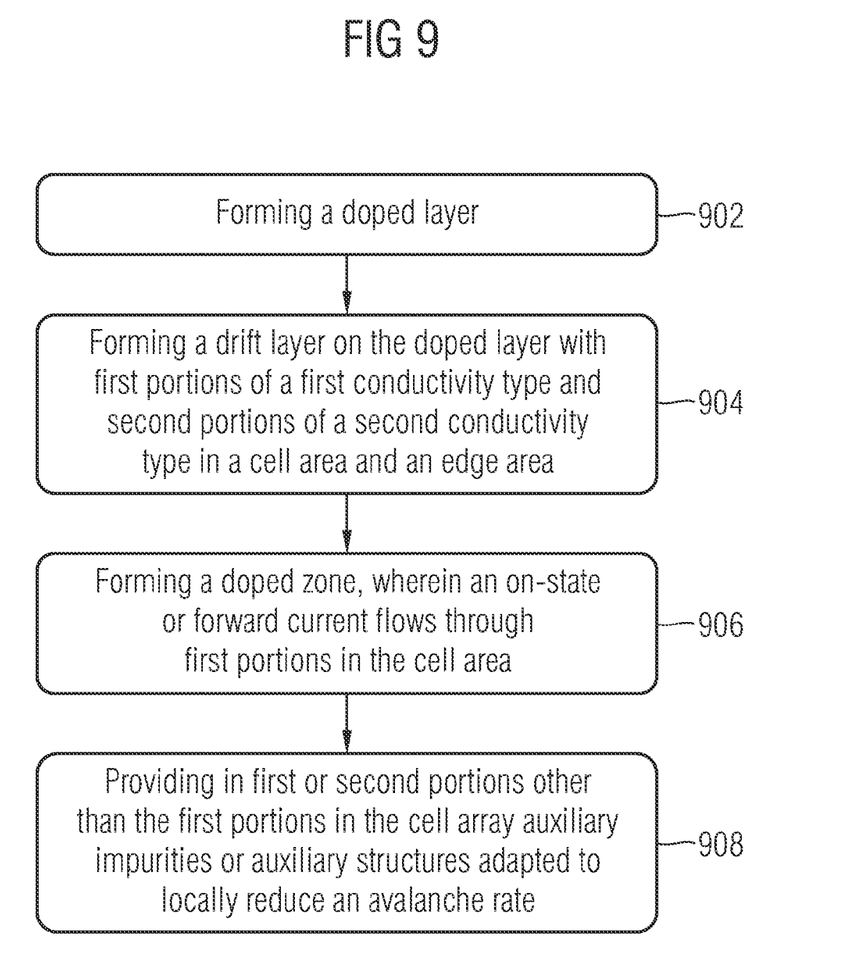
FIG. 9 is a simplified flowchart of a method of manufacturing a super junction semiconductor device.

FIG. 9 refers to a method of manufacturing a super junction semiconductor device. A doped layer of a first conductivity type is formed (902). On the doped layer, a drift layer is formed, wherein the drift layer includes a cell area and an edge area surrounding the cell area and wherein first portions of the first conductivity type and second portions of a second conductivity type opposite to the first conductivity type are formed in the cell and edge areas (904). Above the drift layer, at least one doped zone is formed in the cell area, wherein an on-state or forward current between the at least one doped zone and the doped layer flows through the first portions in the cell area (906). At least one of the first and second portions other than the first portions in the cell area are provided with an auxiliary structure or with auxiliary impurities reducing the avalanche rate (908).

According to an embodiment, the drift layer is formed by epitaxial growth. For example, the drift layer may be formed by one growth step. Subsequently, trenches may be etched into the grown epitaxial layer and the first and second portions may be formed by out-diffusion of sidewall implants and/or further epitaxial growth in the etched trenches.

According to another embodiment the drift layer is formed by re-iterating a process sequence that includes epitaxial growth of a sub-layer and at least one implant. For example, the grown sub-layer may be of the first conductivity type and the grown sub-layer may be counter-doped in areas assigned to the second portions using an implant mask shielding areas reserved for the first portions. According to another embodiment, an intrinsic sub-layer is grown, the first portions are formed by an implant using a first implant mask shielding at least the second portions, and the second portions are formed by an implant using a second implant mask shielding at least the first portions.

According to an embodiment, at least one of the iterated sequences comprises providing auxiliary impurities in selected areas provided for the auxiliary impurities. According to an embodiment, the implant process may include a masked auxiliary implant using an implant mask shielding the cell area or a central section of the cell area and not shielding the edge area.

The auxiliary impurities may be implanted at different depths by using different implant energies. A net dopant concentration may vary from sub-layer to sub-layer and for each sub-layer the net-dopant concentration may be a function of a distance to the cell area.

In accordance with a further embodiment, the grown sub-layer is doped by a first mask implant using a first implant mask shielding areas assigned to the second portions in the cell array and a second mask implant using a second implant mask shielding areas assigned to the first portions in the cell array. The one of the first and second mask implants with the lower implant dose uses a mask not shielding the edge area and the one of the first and second mask implants with the higher implant dose uses a mask with wider openings in the edge area than in the cell area. The same net dopant concentration can be achieved as with two usually patterned implants but at a higher absolute dopant concentration which results in increased scattering and a lower avalanche rate.

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, embodiments related to IGFETs and IGBTs may include gate electrode structures formed in trenches etched into the drift layer from the first surface. This application is intended to cover any adaptations or variations of the specific embodiments discussed herein. Therefore, it is intended that this invention be limited only by the claims and the equivalents thereof.

What is claimed is:

1. A super junction semiconductor device comprising:
at least one doped zone in a cell area;
a drift layer formed in the cell area and in an edge area surrounding the cell area, the drift layer comprising first portions of the first conductivity type and second portions of a second conductivity type opposite to the first conductivity type, an on-state or forward current from/to the at least one doped zone flowing through the first portions in the cell area; and
wherein at least one of the first and second portions other than the first portions in the cell area contain auxiliary impurities or include an auxiliary structure operable to locally reduce an avalanche rate.

2. The super junction semiconductor device of claim 1, wherein the auxiliary impurities are operable to locally reduce a charge carrier mean free path.

3. The super junction semiconductor device of claim 1, wherein the auxiliary impurities are operable to locally reduce an electric field strength.

4. The super junction semiconductor device of claim 1, wherein the auxiliary structure is operable to locally reduce an electric field strength.

5. The super junction semiconductor device of claim 1, wherein the auxiliary impurities are operable to increase scattering of charge carriers in the drift layer.

6. The super junction semiconductor device of claim 1, wherein the auxiliary impurities substitute atoms of a semiconductor material forming the drift layer in a crystal lattice of the semiconductor material and are suitable to scatter charge carriers by the perturbation of a crystal potential of the crystal lattice.

7. The super junction semiconductor device of claim 1, wherein the auxiliary impurities are effective as donors or acceptors and at least partially compensate for a doping of the second portions by impurities of the second conductivity type.

8. The super junction semiconductor device of claim 1, wherein the auxiliary impurities are effective as donors and acceptors and compensate for each other.

9. The super junction semiconductor device of claim 1, wherein at least one of the second portions in the edge area contains the auxiliary impurities or includes the auxiliary structure.

10. The super junction semiconductor device of claim 1, wherein all second portions in the cell and edge areas contain the auxiliary impurities or includes the auxiliary structures.

11. The super junction semiconductor device of claim 1, wherein at least one of the first portions in the edge area contains the auxiliary impurities.

12. The super junction semiconductor device of claim 1, wherein all of the first and second portions in the edge area contain the auxiliary impurities.

13. The super junction semiconductor device of claim 1, wherein the first and second portions are stripe-shaped and are arranged in alternating order along a direction perpendicular to a flow direction of the on-state or forward current.

14. The super junction semiconductor device of claim 1, wherein the auxiliary structures are provided from a charged dielectric material.

15. The super junction semiconductor device of claim 1, wherein each auxiliary structure has a mean dielectric permittivity deviating from that of a semiconductor material of the drift layer by not more than 20%.

16. The super junction semiconductor device of claim 1, wherein each auxiliary structure comprises at least two sub-layers of different materials.

17. The super junction semiconductor device of claim 1, wherein each auxiliary structure is arranged in a central portion of one of the second portions.

18. The super junction semiconductor device of claim 1, wherein the auxiliary impurities and the auxiliary structure are absent in the first portions in the cell area.

19. A super junction diode comprising the super junction semiconductor device of claim 1, wherein the at least one doped zone is of the second conductivity type and directly adjoins the first and second portions in the cell area.

20. A super junction insulated gate field effect transistor comprising the super junction semiconductor device of claim 1, wherein each of the doped zones is of the first conductivity type and directly adjoins a base zone of the second conductivity type, each base zone directly adjoining at least one the first and to one of the second portions.

21. A method of manufacturing a super junction semiconductor device, the method comprising:
forming a drift layer, the drift layer comprising, in a cell area and in an edge area surrounding the cell area, first portions of the first conductivity type and second portions of a second conductivity type opposite to the first conductivity type;
forming at least one doped zone above the drift layer in the cell area, wherein an on-state current or forward current from/to the at least one doped zone flows through the first portions in the cell area; and
providing in at least one of the first and second portions other than the first portions in the cell area auxiliary impurities or an auxiliary structure operable to locally reduce an avalanche rate.

22. The method of claim 21, wherein the drift layer is formed by iterating a process sequence comprising growing a sub-layer by epitaxy and implanting dopants into the sub-layer.

23. The method of claim 22, wherein at least one of the iterated process sequences comprises providing the auxiliary impurities by an auxiliary implant process.

24. The method of claim 23, wherein the auxiliary implant process comprises a masked implant using an implant mask shielding the cell area and not-shielding at least a part of the edge area.

25. The method of claim 23, wherein the grown sub-layer is intrinsic, sections of the first portions are implanted using a first implant mask shielding the second portions, and sections of the second portions are implanted using a second implant mask shielding the first portions.

26. The method of claim 25, wherein the one of the first and second masked implants with the lower implant dose uses a mask not shielding the edge area and the one of the first and second masked implants with the higher implant dose uses a mask with wider openings in the edge area than in the cell area.

\* \* \* \* \*

UNITED STATES PATENT AND TRADEMARK OFFICE
CERTIFICATE OF CORRECTION

| | | |
|---|---|---|
| PATENT NO. | : 8,866,221 B2 | Page 1 of 1 |
| APPLICATION NO. | : 13/539973 | |
| DATED | : October 21, 2014 | |
| INVENTOR(S) | : Hirler et al. | |

It is certified that error appears in the above-identified patent and that said Letters Patent is hereby corrected as shown below:

In the Claim

Column 12, line 35-36 claim 20, change "least one the first and to one of" to -- least one of the first and one of --

Signed and Sealed this
Seventeenth Day of February, 2015

Michelle K. Lee
*Deputy Director of the United States Patent and Trademark Office*